United States Patent
Tsubaki et al.

(10) Patent No.: US 7,318,985 B2
(45) Date of Patent: Jan. 15, 2008

(54) BLOCK COPOLYMER COMPOSITION FOR PHOTOSENSITIVE FLEXOGRAPHIC PLATE

(75) Inventors: Hidemi Tsubaki, Tokyo (JP); Shinya Ikeda, Tokyo (JP)

(73) Assignee: Zeon Corporation, Tokyo (JP)

( * ) Notice: Subject to any disclaimer, the term of this patent is extended or adjusted under 35 U.S.C. 154(b) by 0 days.

(21) Appl. No.: 10/573,292

(22) PCT Filed: Sep. 24, 2004

(86) PCT No.: PCT/JP2004/013939

§ 371 (c)(1),
(2), (4) Date: Mar. 23, 2006

(87) PCT Pub. No.: WO2005/031459

PCT Pub. Date: Apr. 7, 2005

(65) Prior Publication Data

US 2006/0263715 A1    Nov. 23, 2006

(30) Foreign Application Priority Data

Sep. 25, 2003    (JP)    ............... 2003-332737

(51) Int. Cl.
*G03F 7/033*    (2006.01)
(52) U.S. Cl. .............. 430/18; 430/287.1; 430/281.1; 430/306; 430/907; 430/286.1; 522/110
(58) Field of Classification Search .............. None
See application file for complete search history.

(56) References Cited

U.S. PATENT DOCUMENTS

| | | | | |
|---|---|---|---|---|
| 5,075,377 | A | * 12/1991 | Kawabuchi et al. | ......... 525/89 |
| 6,025,098 | A | * 2/2000 | Sakurai et al. | ......... 430/18 |
| 6,037,101 | A | * 3/2000 | Telser et al. | ......... 430/286.1 |
| 6,326,127 | B1 | * 12/2001 | Morren et al. | ......... 430/286.1 |
| 2002/0001775 | A1 | * 1/2002 | Knoll | ......... 430/280.1 |
| 2005/0137312 | A1 | * 6/2005 | DuBois | ......... 524/474 |

FOREIGN PATENT DOCUMENTS

| | | | |
|---|---|---|---|
| EP | 696761 A1 | * | 2/1996 |
| JP | 7-72795 B2 | | 8/1995 |
| JP | 8-69107 A | | 3/1996 |
| JP | 10-31303 A | | 2/1998 |
| JP | 10-73921 A | | 3/1998 |
| JP | 10-288838 A1 | | 10/1998 |
| JP | 2002-72457 A | | 3/2002 |
| JP | 2002-519465 A | | 7/2002 |
| JP | 2002-534714 A | | 10/2002 |

OTHER PUBLICATIONS

Derwent- Acc-No. 1987-324793, Nippon Zeon KK Patent Family PUb No. JP 62231248 A, dated Oct. 9, 1987, two pages, English abstract.*
Patent Abstracts of JAPAN Publication No. 62:231248, Nippon Zeon Co Ltd, Oct. 9, 1987, two pages, English Abstract.*
English translation of JP, 10-073921, A (1998) from machine translation from AIPN Japan Patent Office Natinal center for Industrial Property Information and Training, generated Aug. 5, 2007, 11 pages.*

* cited by examiner

*Primary Examiner*—Cynthia Hamilton
(74) *Attorney, Agent, or Firm*—Birch, Stewart, Kolasch & Birch, LLP

(57) ABSTRACT

A composition for photosensitive flexographic plates which is capable of forming a sheet having a smooth surface and excellent antiflowing properties and less apt to have trouble caused by sticking and which further has excellent thin-line reproducibility; a block copolymer composition for photosensitive flexographic plates which is suitable for use in the composition; and a flexographic plate obtained by exposing the composition to light. Also provided are: a block copolymer composition containing a three-branched aromatic vinyl/conjugated diene block copolymer obtained with a specific coupling agent; and a composition for photosensitive flexographic plates which comprises an ethylenic compound and a photopolymerization initiator.

16 Claims, No Drawings

BLOCK COPOLYMER COMPOSITION FOR PHOTOSENSITIVE FLEXOGRAPHIC PLATE

TECHNICAL FIELD

The present invention relates to a composition for photosensitive flexographic plates which is capable of forming a sheet having a smooth surface and excellent antiflowing properties and less apt to occur troubles caused by sticking and which further has excellent thin-line reproducibility, a block copolymer composition for photosensitive flexographic plates which is suitable for use in the composition, and a flexographic plate obtained by exposing the composition to light.

BACKGROUND ART

The surfaces of plastic containers, cartons, vinyl bags, boxes and envelopes are usually subjected to flexographic printing. As flexographic plates used in this flexographic printing, those formed by exposure, to light, of a composition for photosensitive flexographic plates which comprises an elastomer, a polymerizable ethylenically unsaturated monomer and a photopolymerizable initiator, are frequently used.

The composition for photosensitive flexographic plates is usually formed into a sheet and supplied as a multilayer sheet having a plastic sheet as a supporting body arranged on one side and a protective film arranged on the other side. By exposing the multilayer sheet to light at the side of the supporting body, the layer of the composition for photosensitive flexographic plates is cured to specific thickness. Then, the protective film is removed and a negative film is stuck to the surface of the composition layer, and the negative film is irradiated with light. The light-permeated part of the composition for photosensitive flexographic plates is cured, and an uncured part is removed by an organic solvent or an aqueous solvent, whereby a flexographic plate having an embossed structure is formed.

For the purpose of facilitating formation of an accurate embossed surface, it is desired that when the composition for photographic flexographic plates is formed into a sheet, a smooth surface is formed, and when the sheet-shaped composition for photographic flexographic plates is stored, the thickness of the sheet is hardly changed (due to excellent antiflowing properties) regardless of its own weight or a loading on the sheet.

For the purpose of removing the protective film without roughing the surface, the composition for photographic flexographic plates is required to be hardly sticky.

For high-quality printing, the composition for photographic flexographic plates is required to be excellent in thin-line reproducibility in a negative film.

Conventionally, JP-B 7-72795, for example, discloses a composition for photosensitive flexographic plates, which comprises a linear aromatic vinyl/conjugated diene/aromatic vinyl block copolymer, an ethylenically unsaturated monomer and a photopolymerization initiator, said block copolymer being obtained by using, as a coupling agent, an ester compound made from a monovalent aliphatic carboxylic acid and a monovalent alcohol. Such composition gives a flexographic plate excellent in antiflowing properties and thin-line reproducibility, but there is the case where the surface of the sheet is poor in smoothness and becomes easily sticky.

JP-A 10-288838 discloses a composition for photosensitive flexographic plates, which comprises a hydrogenated block copolymer obtained by selectively hydrogenating a conjugated diene unit in the styrene/conjugated diene/styrene block copolymer, an ethylenically unsaturated monomer and a photopolymerization initiator. Such composition gives a flexographic plate less apt to occur troubles caused by sticking and excellent in thin-line reproducibility, but there is the case where the surface of the sheet is inferior in smoothness and antiflowing properties.

Japanese Patent Application National Publication (Laid-Open) No. 2002-519465 discloses a composition for photosensitive flexographic plates, which comprises a block copolymer composition, an ethylenically unsaturated monomer and a photopolymerization initiator, wherein the block copolymer composition comprises an aromatic vinyl/conjugated diene/aromatic vinyl block copolymer containing 5 to 25% by weight aromatic vinyl monomer unit, and an aromatic vinyl/conjugated diene block copolymer having a weight-average molecular weight of 1,000 to 35,000. Such composition gives a flexographic plate excellent in thin-line reproducibility, but there is the case where the surface of the sheet is inferior in smoothness and antiflowing properties, and troubles caused by sticking occur.

DISCLOSURE OF INVENTION

Problem to be Solved by the Invention

In view of the foregoing circumstances, the object of the present invention is to provide a composition for photosensitive flexographic plates which is capable of forming a sheet having a smooth surface and excellent antiflowing properties and less apt to occur troubles caused by sticking and which further has excellent thin-line reproducibility, a block copolymer composition for photosensitive flexographic plates which is suitable for use in the composition, and a flexographic plate obtained by exposing the composition to light.

Means for Solving the Problem

As a result of extensive study for solving the problem described above, the present inventors found that the object can be achieved by using a block copolymer composition comprising a tri-branched aromatic vinyl/conjugated diene block copolymer obtained by using a specific coupling agent, and on the basis of this finding, the present invention was arrived at.

According to the present invention, there is provided a block copolymer composition for photosensitive flexographic plates, which comprises:

at least one kind of block copolymer (a) selected from block copolymers represented by the following general formulae (a1) to (a3), and a block copolymer (b) represented by the following general formula (b):

$$(A\text{-}B)_2 X \quad \text{(a1)}$$

$$(A\text{-}B)_3 X \quad \text{(a2)}$$

$$(A\text{-}B)_4 X \quad \text{(a3)}$$

$$A\text{-}B \quad \text{(b)}$$

wherein A is a polymer block of an aromatic vinyl monomer, B is a polymer block of a conjugated diene monomer, and X is a residue of a coupling agent having two or more functional groups of at least one kind selected from an alkoxyl group, an ester group and an epoxy group in the general formulae a1, a2, a3 and b, and which satisfies the following relationships:
Wa=50 to 100% by weight,
Wb=0 to 50% by weight, and $$2.5 \leq (2 \times W2 + 3 \times W3 + 4 \times W4)/(W2+W3+W4) \leq 3.8$$

wherein Wa, W2, W3, W4, and Wb are the contents, in terms of % by weight, of (a), (a1), (a2), (a3), and (b) respectively.

According to the present invention, there is provided a composition for photosensitive flexographic plates, which comprises the block copolymer composition for photosensitive flexographic plates described above, an ethylenically unsaturated compound and a photopolymerization initiator.

According to the present invention, there is provided a flexographic plate obtained by exposing, to light, the composition for photosensitive flexographic plates described above.

Effect of the Invention

According to the present invention, there are provided a composition for photosensitive flexographic plates which is capable of forming a sheet having a smooth surface and excellent antiflowing properties and less apt to occur troubles caused by sticking and which further has excellent thin-line reproducibility, a block copolymer composition for photosensitive flexographic plates which is suitable for use in the composition, and a flexographic plate obtained by exposing the composition to light.

BEST MODE FOR CARRYING OUT THE INVENTION

Hereinafter, the present invention is described in more detail.

(Block Copolymer Composition for Photosensitive Flexographic Plates)

The block copolymer composition for photosensitive flexographic plates of the present invention is a block copolymer composition for photosensitive flexographic plates, which comprises:

at least one kind of block copolymer (a) selected from block copolymers represented by the following general formulae (a1) to (a3), and a block copolymer (b) represented by the following general formula (b):

(a1)

(a2)

(a3)

(b)

wherein A is a polymer block of an aromatic vinyl monomer, B is a polymer block of a conjugated diene monomer, and X is a residue of a coupling agent having two or more functional groups of at least one kind selected from an alkoxyl group, an ester group and an epoxy group in the general formulae a1, a2, a3 and b,
and which satisfies the following relationships:
Wa=50 to 100% by weight,
Wb=0 to 50% by weight, and $$2.5 \leq (2 \times W2 + 3 \times W3 + 4 \times W4)/(W2+W3+W4) \leq 3.8$$

wherein Wa, W2, W3, W4, and Wb are the contents, in terms of % by weight, of (a), (a1), (a2), (a3), and (b) respectively.

The block copolymer (a) is at least one kind of block copolymer selected from the block copolymers represented by the general formulae (a1) to (a3), and may be only one block copolymer or a mixture comprising of two or more kinds of block copolymers.

The content Wa of the block copolymer (a) is 50 to 100% by weight, preferably 55 to 95% by weight, more preferably 55 to 90% by weight, based on the total amount of the block copolymer composition for photosensitive flexographic plates. When this content is too low, the resulting composition is poor in antiflowing properties, becomes easily sticky and deteriorates thin-line reproducibility.

In the block copolymer composition for photosensitive flexographic plates of the present invention, it is an essential condition to satisfy the following relationship (1), and it is preferable to satisfy the following relationship (2):

$$2.5 \leq (2 \times W2 + 3 \times W3 + 4 \times W4)/(W2+W3+W4) \leq 3.8 \quad (1)$$

$$2.8 \leq (2 \times W2 + 3 \times W3 + 4 \times W4)/(W2+W3+W4) \leq 3.5 \quad (2)$$

wherein W2, W3 and W4 refer to the contents, in terms of % by weight, of the block copolymers represented by the general formulae (a1), (a2) and (a3), respectively.

When the lower limit of the relationship (1) is less than 2.5, the resulting composition is poor in antiflowing properties and becomes easily sticky. When the upper limit of the relationship (1) is higher than 3.8, the resulting composition is poor in smoothness and deteriorates thin-line reproducibility.

In the general formulae (a1) to (a3), A is a polymer block of an aromatic vinyl monomer, B is a polymer block of a conjugated diene monomer, and X is a residue of a coupling agent having two or more functional groups of at least one kind selected from an alkoxyl group, an ester group and an epoxy group.

Examples of the aromatic vinyl monomer constituting A include styrene, α-methyl styrene, o-methyl styrene, p-methyl styrene, 2,4-dimethyl styrene, p-ethyl styrene and p-tert-butyl styrene. Among these, styrene is preferable.

The polymer block A is preferably a polymer block obtained by polymerizing an aromatic vinyl monomer only, but may be a copolymer of an aromatic vinyl monomer and another monomer copolymerizable with the aromatic vinyl monomer. Typical examples of another monomer include conjugated diene monomers such as 1,3-butadiene and isoprene. When another monomer is copolymerized, the ratio of another monomer unit in the polymer block A is preferably 10% by weight or less.

The weight-average molecular weight of the polymer block A is preferably 5,000 to 50,000, more preferably 8,000 to 40,000.

Examples of the conjugated diene monomer constituting B include 1,3-butadiene, isoprene, 2,3-dimethyl-1,3-butadiene, 2-ethyl-1,3-butadiene and 1,3-pentadiene. Among these, 1,3-butadiene and isoprene are preferable, and isoprene is more preferable. These conjugated diene monomers can be used alone or as a mixture of two or more thereof.

The polymer block B is preferably a polymer block obtained by polymerizing a conjugated diene monomer only, but may be a copolymer of a conjugated diene monomer and another monomer copolymerizable with the conjugated diene monomer. Typical examples of another monomer include aromatic vinyl monomers such as styrene and α-methyl styrene. When another monomer is copolymerized, the ratio of another monomer unit in the polymer block B is preferably 10% by weight or less.

The content of the aromatic vinyl monomer unit is preferably 5 to 25% by weight, more preferably 10 to 20% by weight, still more preferably 13 to 17% by weight, based on the total amount of the polymer blocks A and B. When the content of the aromatic vinyl monomer is in the above range, a composition for photosensitive flexographic plates which is excellent in balance between antiflowing properties and stickiness and further excellent in thin-line reproducibility can be obtained, and a flexographic plate having flexibility suitable for flexographic printing can be produced.

The weight-average molecular weight of the A-B block copolymer moiety is preferably 50,000 to 200,000, more preferably 55,000 to 150,000. When this weight-average molecular weight is in the above range, a sheet excellent in balance between smoothness and stickiness can be obtained.

X in the above general formulae (a1) to (a3) represents a residue of a coupling agent having two or more functional groups of at least one kind selected from an alkoxyl group, an ester group and an epoxy group.

The compound used as a coupling agent is a compound having two or more functional groups of at least one kind selected from an alkoxyl group, an ester group and an epoxy group. Particularly, a coupling agent having two or more alkoxyl groups is preferable.

Incorporation of a block copolymer obtained by using the coupling agent described above is essential for the present invention, and even if a block copolymer obtained by using a halogen-containing coupling agent such as silicon tetrachloride, dimethyl or dichlorosilane is used, the object of the present application cannot be achieved.

Examples of the coupling agent having two or more alkoxyl groups include organotin compounds such as tetramethoxytin and tetraethoxytin; and organosilicon compounds such as dimethyl dimethoxy silane, diphenyl dimethoxy silane, diphenyl diethoxy silane, methyl trimethoxy silane, methyl triethoxy silane, tetramethoxy silane, tetraethoxy silane, tetrabutoxy silane and bis(trimethoxysilyl)ethane. These coupling agents can be used alone or as a mixture of two or more thereof. Among those described above, the organosilicon compound is preferable, the organosilicon compound having four alkoxyl groups is more preferable, and tetramethoxy silane is still more preferably used.

In the case of the coupling agent having alkoxyl groups, one active A-B block polymer chain can react with one alkoxyl group in the coupling agent, thus enabling formation of coupling products, the number of which corresponds to the number of alkoxyl groups in the coupling agent. Depending on reaction conditions, however, there is the case where some alkoxyl groups in the coupling agent are reacted while the other alkoxyl groups remain as they are, or the other alkoxyl groups are denatured in a treatment step after the coupling reaction.

Examples of the coupling agent having two or more ester groups include diester compounds of aliphatic dicarboxylic acid and monovalent alcohol, such as dimethyl adipate and diethyl adipate; and diester compounds of aromatic dicarboxylic acid and monovalent alcohol, such as dimethyl phthalate, diethyl phthalate, dimethyl terephthalate and diethyl terephthalate. These coupling agents can be used alone or as a mixture of two or more thereof. Among those described above, the diester compound of an aliphatic dicarboxylic acid and a monovalent alcohol is preferable, and diethyl adipate can be more preferably used.

In the case of the coupling agent having two or more ester groups, 2 active A-B block polymer chains can react with one ester group in the coupling agent, thus enabling formation of coupling products, the number of which corresponds to twice the number of ester groups in the coupling agent. Depending on reaction conditions, however, there is the case where only one active A-B block polymer chain reacts with one ester group in the coupling agent.

Examples of the coupling agent having two or more epoxy groups include resorcin diglycidyl ether, neopentyl glycol diglycidyl ether, bisphenol A diglycidyl ether, bisphenol F diglycidyl ether, trimethylol propane triglycidyl ether, pentaerythritol tetraglycidyl ether, diglycerol tetraglycidyl ether, sorbitol hexaglycidyl ether, epoxylated soybean oil, epoxylated linseed oil and epoxylated polybutadiene. These coupling agents can be used alone or as a mixture of two or more thereof. Among those described above, the coupling agent having four epoxy groups is preferable, and pentaerythritol tetraglycidyl ether can be more preferably used.

In the case of the coupling agent having epoxy groups, one active A-B block polymer chain can react with one epoxy group, thus enabling formation of coupling products, the number of which corresponds to the number of epoxy groups in the coupling agent. Depending on reaction conditions, however, there is the case where some epoxy groups in the coupling agent are reacted, and the remaining epoxy groups remain as they are, or the remaining groups are denatured in a treatment step after the coupling reaction.

The block copolymer (b) in the present invention is represented by the general formula (b). In the general formula (b), A is a polymer block of an aromatic vinyl monomer, and B is a polymer block of a conjugated diene monomer.

The polymer blocks A and B in the block copolymer (b) are the same as described in the block copolymer (a).

In the present invention, the block copolymer (b) also includes the aromatic vinyl/conjugated diene block copolymer represented by the following general formula (b1) or (b2) obtained by reacting one active A-B block polymer chain with one molecule of the coupling agent.

A-B-X                                (b1)

X-A-B                                (b2)

wherein A is a polymer block of an aromatic vinyl monomer, B is a polymer block of a conjugated diene monomer, X is a residue of a coupling agent having two or more functional groups of at least one kind selected from an alkoxyl group, an ester group and an epoxy group.

A, B and X in the general formulae (b1) and (b2) are the same as described above in the block copolymer (a).

The content of the aromatic vinyl monomer unit in the block copolymer (b) is preferably 5 to 25% by weight, more preferably 10 to 20% by weight, still more preferably 13 to 17% by weight. When the content of the aromatic vinyl monomer unit is in the above range, a composition for photosensitive flexographic plates excellent in balance between antiflowing properties and stickiness and further excellent in thin-line reproducibility can be obtained, and a flexographic plate having flexibility suitable for flexographic printing can be produced.

The weight-average molecular weight of the block copolymer (b) is preferably 50,000 to 200,000, more preferably 55,000 to 150,000. When this weight-average molecular weight is in the above range, a sheet-shaped composition for photosensitive flexographic plates excellent in balance between smoothness and stickiness can be obtained.

The content Wb of the block copolymer (b) is 0 to 50% by weight, preferably 5 to 45% by weight, more preferably 10 to 45% by weight, based on the total amount of the block copolymer composition for photosensitive flexographic plates. When this content is too high, the resulting composition is poor in antiflowing properties, becomes easily sticky and deteriorates thin-line reproducibility.

The content of the aromatic vinyl monomer unit is preferably 5 to 25% by weight, more preferably 10 to 20% by weight, still more preferably 13 to 17% by weight, based on the whole of the block copolymer composition for photosensitive flexographic plates of the present invention. When the content of the aromatic vinyl monomer unit is in the above range, a composition for photosensitive flexographic plates excellent in balance between antiflowing properties and stickiness and further excellent in thin-line reproducibility can be obtained, and a flexographic plate having flexibility suitable for flexographic printing can be produced.

The weight-average molecular weight of the whole of the block copolymer composition for photosensitive flexographic plates of the present invention is preferably 100,000 to 500,000, more preferably 150,000 to 400,000. When this weight-average molecular weight is in the above range, a sheet-shaped composition for photosensitive flexographic plates more excellent in balance among antiflowing properties, smoothness and stickiness can be obtained.

The content of the vinyl bond unit (vinyl content) based on the whole of the conjugated diene monomer unit in the block copolymer composition for photosensitive flexographic plates of the present invention is not particularly limited, but is usually 70% by weight or less, more preferably 3 to 60% by weight, still more preferably 5 to 40% by weight.

The block copolymer composition for photosensitive flexographic plates of the present invention is preferably a composition comprising 0 to 20% by weight of the block copolymer (a1), 40 to 100% by weight of the block copolymer (a2), 0 to 50% by weight of the block copolymer (a3) and 0 to 50% by weight of the block copolymer (b) represented by the general formula (b), more preferably a composition comprising 0 to 15% by weight of the block copolymer (a1), 40 to 95% by weight of the block copolymer (a2), 0 to 45% by weight of the block copolymer (a3) and 5 to 45% by weight of the block copolymer (b), still more preferably a composition comprising 0 to 10% by weight of the block copolymer (a1), 45 to 95% by weight of the block copolymer (a2), 0 to 45% by weight of the block copolymer (a3) and 10 to 45% by weight of the block copolymer (b).

The copolymer composition for photosensitive flexographic plates of the present invention may be produced by producing the block copolymers of the general formulae (a1) to (a3) and (b) respectively and mixing the copolymers with one another so as to satisfy the prescription of the present invention or by producing the composition comprising of a plurality of mixtures in a series of polymerization procedures. The latter method is preferable in respect of excellent productivity.

In either method, the block copolymer can be produced by a conventional method, that is, an anion living polymerization method.

When the block copolymer composition for photosensitive flexographic plates is obtained by a series of polymerization procedures, the production can be carried out in the following manner.

(Step 1) An aromatic vinyl monomer is polymerized in the presence of an anion polymerization catalyst in an inert solvent, to form an aromatic vinyl polymer block having an active terminal at the terminal of the polymer chain.

(Step 2) Subsequently, a conjugated diene monomer is polymerized to form a block copolymer comprising of an aromatic vinyl polymer block/conjugated diene polymer block, having an active terminal at the terminal of the polymer chain.

(Step 3) Then, a coupling agent is added to, and subjected to coupling reaction with, the block copolymer having an active terminal at the terminal of the polymer chain to form a desired coupling product.

(Step 4) If necessary, a polymerization terminator is added to terminate the polymerization reaction, and then the inert solvent is removed, whereby the block copolymer composition is obtained.

In the above-mentioned (Step 1), an inert solvent such as cyclohexane, hexane or toluene can be used, and n-butyl lithium or sec-butyl lithium can be used as the anion polymerization catalyst. The amount of the anion polymerization catalyst used is selected suitably in such a range that the compositional ratio and weight-average molecular weight of the finally obtained block copolymer composition are in a desired range.

In the above-mentioned (Step 2), for the purpose of controlling the heating value on polymerizing, the polymerization is carried out preferably while a conjugated diene monomer is added to the reaction system, and the polymerization reaction is continued preferably until the conjugated diene monomer reacts almost quantitatively.

By suitably using a vinylating agent such as N,N,N',N'-tetramethyl ethylene diamine or ethylene glycol dibutyl ether, the ratio of the vinyl bond unit (vinyl content) to the total amount of the conjugated diene monomer unit can also be controlled in a desired range. This vinylating agent may be previously added to a reactor in the above-mentioned (Step 1).

In the above-mentioned (Step 3), the amount of the coupling agent used is selected suitably such that the compositional ratio of each coupling product is in a desired range.

In the above-mentioned (Step 4), when the block copolymer composition is intended to be obtained, an antioxidant such as 2,6-di-tert-butyl-p-cresol may be added to a solution of the block copolymer composition.

A desired amount of the block copolymer (b) can be previously formed by adding a polymerization terminator in an amount to inactivate a part of the block copolymer having an active terminal at the terminal of the polymer chain in the reaction system between the above-mentioned (Step 2) and (Step 3).

From the solution containing the block copolymer composition thus obtained, a solid of the block copolymer composition can be obtained by removing the inert solvent through steam stripping.

(Composition for Photosensitive Flexographic Plates)

The composition for photosensitive flexographic plates of the present invention comprises the above block copolymer composition for photosensitive flexographic plates, an ethylenically unsaturated compound and a photopolymerization initiator.

The amount of the block copolymer composition for photosensitive flexographic plates is preferably 40 to 95% by weight, more preferably 50 to 95% by weight, based on the total amount of the block copolymer composition for photographic flexographic plates and the ethylenically unsaturated compound.

Examples of the ethylenically unsaturated compound include diacrylates or dimethacrylates of divalent alcohols such as ethylene glycol, diethylene glycol, propylene glycol, dipropylene glycol, polyethylene glycol, polypropylene glycol, 1,4-butane diol and 1,6-hexane diol; trimethyl propane triacrylate or trimethacrylate; pentaerythritol tetraacrylate or tetramethacrylate; and other compounds such as N,N'-hexamethylene bisacrylamide, N,N'-hexamethylene bismethacrylamide, diacetone acrylamide, diacetone methacrylamide, styrene, vinyltoluene, divinylbenzene, diallyl phthalate and triallyl cyanurate. These may be used alone or as a mixture of two or more thereof.

The amount of the ethylenically unsaturated compound used is preferably 5 to 60% by weight, more preferably 5 to 50% by weight, based on the total amount of the block copolymer composition for photographic flexographic plates and the ethylenically unsaturated compound.

The total amount of the block copolymer composition for photosensitive flexographic plates and the ethylenically unsaturated compound is preferably 50% by weight or more, more preferably 60% by weight or more, still more preferably 70% by weight or more.

Examples of the photopolymerization initiator include benzophenone, benzoin, benzoin methyl ether, benzoin ethyl ether, benzoin isopropyl ether, benzoin isobutyl ether, α-methyl benzoin, α-methyl benzoin methyl ether, α-methoxy benzoin methyl ether, benzoin phenyl ether, α-t-butyl benzoin, anthraquinone, benzanthraquinone, 2-ethyl anthraquinone, 2-chloroanthraquinone, 2-2'-dimethoxydiphenyl acetophenone, 2,2-diethoxyphenyl acetophenone, 2,2-diethoxy acetophenone and pivaloin. These may be used alone or as a mixture of two or more thereof.

The amount of the photopolymerization initiator used is preferably 0.1 to 5% by weight based on the total amount of the copolymer composition for photosensitive flexographic plates and the ethylenically unsaturated compound.

In the present invention, components other than those described above can be added if necessary to the composition for photosensitive flexographic plates. Such components include, for example, a plasticizer, a thermal-polymerization inhibitor, an antioxidant, an antiozonant, a dye, a pigment, a filler, an additive showing photochromism, a reducing agent, a chemical improving a relief structure, a crosslinking agent, a flow improver and a release agent.

The plasticizer is used usually for the purpose of facilitating production and molding of the composition for photosensitive flexographic plates, promoting removal of a light-unexposed part, and controlling the hardness of a light-exposed cured part.

Examples of the plasticizer include hydrocarbon oils such as naphthene oil and paraffin oil; liquid 1,2-polybutadiene, liquid 1,4-polybutadiene and hydroxides or carboxylated products thereof; liquid acrylonitrile/butadiene copolymer and carboxylated products thereof; liquid styrene/butadiene copolymer and carboxylated products thereof; and other plasticizers such as low-molecular-weight polystyrene having a molecular weight of 3,000 or less, α-methyl styrene/vinyl toluene copolymer, petroleum resin, polyacrylate resin, polyester resin and polyterpene resin. These may be used alone or as a mixture of two or more thereof. Depending on desired properties, the plasticizer is added in the range of 2 to 50% by weight in the composition for photosensitive flexographic plates.

The thermal-polymerization inhibitor is used for the purpose of preventing unintended thermal polymerization of the ethylenically unsaturated compound in preparation of the composition for photosensitive flexographic plates.

Examples of the thermal-polymerization inhibitor include phenols such as hydroquinone, p-methoxy phenol, p-t-butyl catechol, 2,6-di-t-butyl-p-cresol and pyrogallol; quinones such as benzoquinone, p-toluquinone and p-xyloquinone; and amines such as phenyl-α-naphthyl amine. These may be used alone or as a mixture of two or more thereof.

The amount of the heat-polymerization inhibitor used is usually 0.001 to 2% by weight in the composition for photosensitive flexographic plates.

The method of producing the composition for photosensitive flexographic plates of the present invention is not particularly limited. For example, there is a method of kneading the components constituting the composition by using a kneader, a roll mill, a Banbury mixer, a single- or twin-screw extruder or the like to produce the composition. The resulting composition is formed usually into a sheet-shaped molded product having desired thickness by using a molding machine such as a single- or multi-screw extruder, a compression molding machine, a calender molding machine or the kike. When a single- or multi-screw extruder is used, preparation of the composition for photosensitive flexographic plates and molding thereof into a sheet-shaped molded product can be simultaneously conducted.

Alternatively, the components constituting the composition for photosensitive flexographic plates can be dissolved in a suitable solvent such as chloroform, carbon tetrachloride, trichloroethane, diethyl ketone, methyl ethyl ketone, benzene, toluene or tetrahydrofuran, followed by injecting the resulting solution into a frame and evaporating the solvent to produce a sheet-shaped composition for photosensitive flexographic plates.

The thickness of the sheet is usually 0.1 to 20 mm, preferably 1 to 10 mm.

The sheet-shaped composition for photosensitive flexographic plates can be provided thereon with a transparent sheet or film comprising of a resin such as polypropylene, polyethylene or polyethylene terephthalate as a base sheet layer or a protective film layer, in order to prevent pollution or damage of the composition for photosensitive flexographic plates in storage or operation.

The surface of the sheet-shaped composition for photosensitive flexographic plates may be provided with a highly plastic thin coating layer in order to suppress stickiness on the surface of the composition and to re-utilize the negative film after exposure to light. In this case, when a light-unexposed part is removed with a solvent after light exposure of the composition for photosensitive flexographic plates, the coating layer should also be simultaneously removed. As the coating layer, soluble polyamide and cellulose derivatives are frequently used.

(Flexographic Plate)

The flexographic plate of the present invention can be obtained by exposing the above composition for photosensitive flexographic plates to light.

Production of the flexographic plate is conducted usually according to the following steps:

(1) The multilayer sheet comprising of a protective film, the sheet-shaped composition layer for photosensitive flexographic plates and a base sheet is irradiated with light at the side of the base sheet, whereby the composition layer for photosensitive flexographic plates is cured to specific thickness.

(2) The protective film is removed, a negative film is allowed to adhere to the composition layer for photosensitive flexographic plates, and the composition layer is exposed to light of a wavelength of 230 to 450 nm, preferably 350 to 450 nm by irradiating at the side of the negative film. By this light exposure, the light-permeated part of the composition layer for photosensitive flexographic plates is cured.

(3) A light-unexposed part of the composition layer for photosensitive flexographic plates remains uncured, so this part can be removed (development).

(4) In the above step (3), the uncured part is removed usually with a solvent, and thus the solvent remaining in the flexographic plate is removed by evaporation.

(5) If necessary, post-light exposure is carried out.

In the development step (removal of the light-unexposed part) in the above step (3), a solvent is usually used.

Examples of the solvent include aliphatic hydrocarbons or aromatic hydrocarbons such as n-hexane, n-heptane, octane, petroleum ether, naphtha, limonene, terpene, toluene, xylene, ethyl benzene and isopropyl benzene; ketones such as acetone and methyl ethyl ketone; ethers-such as di-n-butyl ether and di-t-butyl ether; esters such as methyl acetate and ethyl acetate; and halogenated hydrocarbons such as methylene chloride, chloroform, trichloroethane, tetrachloroethylene, dichlorotetrafluoroethane and trichlorofluoroethane. These may be used alone or as a mixture of two or more thereof. An alcohol such as methanol, ethanol, isopropanol or n-butanol may also be used in a desired amount by adding to the above solvent.

The development can be accelerated by applying mechanical strength with a brush or the like in the presence of the solvent.

The flexographic plate of the present invention is excellent in thin-line reproducibility of a negative film and has suitable flexibility, and can thus achieve high-quality flexographic printing without undergoing any influence of a printing material and the surface shape thereof.

The printing material to which the flexographic plate can be applied includes various materials such as paper, corrugated cardboard, wood, metal, polyethylene film, polyethylene sheet, polypropylene film and polypropylene.

EXAMPLES

Hereinafter, the present invention is described in more detail by reference to the Examples. "%" and "parts" refer to % by weight and parts by weight respectively unless otherwise specified.

[Evaluation Method]

(Weight-average Molecular Weight of the Polymer)

Using tetrahydrofuran as an eluent, the weight-average molecular weight was determined by gel permeation chromatography in terms of standard polystyrene equivalents.

(Ratio of the Respective Block Copolymers)

Using tetrahydrofuran as an eluent, the block copolymers were measured by gel permeation chromatography, and from the obtained measurement chart, the areas of peaks corresponding respectively to a styrene/isoprene di-block copolymer, a coupling product (di-branched product) having 2 styrene/isoprene di-block copolymers bound to each other via the coupling agent, a coupling product (tri-branched product) having 3 styrene/isoprene di-block copolymers bound to one another via the coupling agent, and a coupling product (tetra-branched product) having 4 styrene/isoprene di-block copolymers bound to one another via the coupling agent, were determined respectively to calculate the ratio by weight of the respective block copolymers.

(Calculation by the Formula)

From the above result, the ratio (% by weight) of the di-, tri- and tetra-branched products to the whole composition was calculated according to the following formula:

$$(2 \times W2 + 3 \times W3 + 4 \times W4)/(W2 + W3 + W4) \qquad (3)$$

wherein W2, W3 and W4 refer respectively to the contents (% by weight) of the di-branched, tri-branched and tetra-branched products based on the whole composition.

(Amount of Styrene Units)

The amount of styrene units in the block copolymer was determined by $^1$H-NMR analysis.

(Vinyl Content)

The ratio of the vinyl bond unit (vinyl content) to the total amount of isoprene units in the block copolymer composition was determined by $^1$H-NMR analysis.

(Smoothness of the Sheet)

A polyethylene terephthalate film on one side of the resulting multilayer sheet was removed to expose the surface of the composition for photosensitive flexographic plates which was then left for 24 hours. Thereafter, the state of the surface of the composition for photosensitive flexographic plates was observed with naked eyes and judged under the following criteria.

The number of samples was 10.

5 Points: The surfaces of all samples are smooth.

4 Points: There is one sample having a small uneven surface.

3 Points: There is one or more samples each having an uneven surface.

2 Points: There is one or more samples each having a significant uneven surface.

1 Point: A beautiful sheet cannot be formed.

(Antiflowing Properties of the Sheet)

Polyethylene terephthalate films on both sides of the resulting multilayer sheet were removed to take out the sheet of the composition for photographic flexographic plates. This sheet was punched with dumbbell No. 3 prescribed in JIS K 6251 to give a sample.

Marked lines were drawn at 20-mm intervals in the center of the dumbbell-shaped sample and kept vertically. The sample was observed at suitable intervals at room temperature, and the time having elapsed until the distance between the marked lines exceeded 22 mm (degree of elongation, 10%) was determined. Observation was continued for 240 hours at the maximum.

(Stickiness of the Sheet)

A polyethylene terephthalate film on one side of the resulting multilayer sheet was removed to expose the surface of the composition for photosensitive flexographic plates. The surface of the composition for photosensitive flexographic plates was examined by touch with the fingers to judge the stickiness of the surface of the composition for photosensitive flexographic plates under the following criteria:

○: Practically unproblematic with respect to stickiness.

Δ: Slightly sticky.

x: Practically problematic due to stickiness.

(Thin-line Reproducibility)

One side of the resulting multilayer sheet was exposed to a light from an UV-light exposure machine (JE-A2-SS, manufactured by Nippon Denshi Seiki) until its cured layer became about 1.5 mm in thickness. Then, a polyethylene terephthalate film on the side not exposed to light was removed, and a negative film for reproducibility evaluation was allowed to adhere to the composition layer and then exposed to a light from the above light source for 15 minutes. Thereafter, the negative film was removed, and the light-unexposed part of the composition layer was dissolved and removed with a mixed solvent of trichloroethane/isopropyl alcohol (mixing ratio=80/20).

After drying at 50° C. for 30 minutes, the surface of the composition was further exposed to a light from the above light source for 10 minutes, to give a flexographic plate. The surface of the flexographic plate was observed under a stereoscopic microscope of 50 magnifications, and the state of reproduced thin lines in a convex image part and the state of carved thin lines in a concave image part were observed, evaluated under the following criteria, and expressed in terms of the total point in the following two items.

(Reproducibility of Convex Thin Lines of 0.2 mm in Width)

The case where without warping and thickening, the convex thin line was reproduced with the same width as in the negative film was regarded as "completely reproduced state" and evaluated under the following criteria:

3 Points: State where the negative is completely reproduced.

2 Points: State where the negative is almost reproduced.

1 Point: State where reproduction of the negative is incomplete.

(Reproducibility of Concave Thin Lines of 0.7 mm in Width)

The state where the edge of the concave thin line is sharp without a wavy zigzag and the groove of the concave thin line is deeply carved was regarded as "completely reproduced state" and evaluated under the following criteria:

3 Points: State where the groove of the concave thin line is deep, and the edge is sharply carved.

2 Points: State where the groove of the concave thin line is slightly hollow, but is practically not problematic.

1 Point: State where the depth of the concave line is hollow and practically problematic.

Example 1

Added to a pressure-resistant reactor were 112 parts of cyclohexane, 0.0012 part of N,N,N',N'-tetramethyl ethylene diamine (abbreviated as "TMEDA") and 7.2 parts of styrene, and 0.0441 part of n-butyl lithium was added thereto under stirring at 40° C., and while the polymerization temperature was increased to 50° C., the mixture was polymerized for 1 hour. The degree of polymerization conversion of styrene in this stage was almost 100%. A part of the polymerization solution was sampled to take out polystyrene, and then the weight-average molecular weight thereof was measured. The result is shown in Table 1.

Subsequently, 40.8 parts of isoprene was added thereto continuously over 1 hour. After addition of isoprene was finished, the mixture was polymerized for additional 1 hour. The temperature was controlled such that the polymerization temperature was kept at 50 to 60° C. The degree of polymerization conversion in this stage was almost 100%. A part of the polymerization solution was sampled to take out di-block copolymer, and then the weight-average molecular weight thereof was measured. The result is shown in Table 1.

By adding 0.0254 part of tetramethoxy silane as a coupling agent, the reaction solution was then subjected to coupling reaction for 2 hour. Thereafter, the reaction was terminated by adding 0.1 part of methanol as a polymerization terminator.

To the resulting polymer solution was added 2,6-di-t-butyl-p-cresol as an antioxidant in an amount of 0.3 part per 100 parts of the polymer, and then the resulting solution was dropped little by little to hot water heated at 85 to 95° C. to evaporate the solvent. The resulting precipitate was disrupted and dried with hot air at 85° C. to give a block copolymer composition I. The weight-average molecular weight, vinyl content and styrene unit amount of the block copolymer composition I, and the ratio by weight of the respective block copolymers were measured. The results are shown in Table 1. Numerical values calculated by the relationship are also shown in Table 1.

Kneaded at 170° C. by a kneader were 100 parts by weight of the block copolymer composition I, 10 parts by weight of liquid polybutadiene (NISSO-PB-B-1000, manufactured by Nippon Soda Co., Ltd.), and 2 parts by weight of 2,6-di-t-butyl-p-cresol. Subsequently, the kneading temperature was decreased to 130° C., and then 5 parts of 1,4-butanediol diacrylate, 5 parts of hexanediol dimethacrylate, 0.01 part of methyl hydroquinone and 0.8 part of benzoin isopropyl ether were added thereto and kneaded to give a composition for photosensitive flexographic plates.

The composition for photosensitive flexographic plates was kneaded by a roll mill and then formed into a sheet of 3.2 mm in thickness. The sheet was sandwiched between polyethylene terephthalate films of 100 μm in thickness and then compression-molded at 120° C. to give a multilayer sheet of 3 mm in thickness. This sheet was used to evaluate smoothness, antiflowing properties, stickiness and thin-line reproducibility. The results are shown in Table 1.

Examples 2 to 4

Block copolymer compositions II to IV were obtained by polymerization in the same manner as in Example 1 except that the polymerization formulations shown in Table 1 were used. The physical properties of these block copolymer compositions are shown in Table 1.

Multilayer sheets were obtained in the same manner as in Example 1 except that the block copolymer compositions II to IV were used in place of the block copolymer composition I. These sheets were evaluated for their smoothness, antiflowing properties, stickiness and thin-line reproducibility. The results are shown in Table 1.

Comparative Example 1

Added to a pressure-resistant reactor were 112 parts of cyclohexane, 0.0012 part of N,N,N',N'-tetramethyl ethylene diamine (abbreviated as "TMEDA") and 7.2 parts of styrene, and 0.0441 part of n-butyl lithium was added thereto under stirring at 40° C., and while the polymerization temperature was increased to 50° C., the mixture was polymerized for 1 hour. The degree of polymerization conversion of styrene in this stage was almost 100%. A part of the polymerization solution was collected to recover polystyrene which was then measured for its weight-average molecular weight. The result is shown in Table 1.

Subsequently, 40.8 parts of isoprene was added thereto continuously over 1 hour. After addition of isoprene was finished, the mixture was polymerized for additional 1 hour. The temperature was controlled such that the polymerization temperature was kept at 50 to 60° C. The degree of polymerization conversion in this stage was almost 100%.

The polymerization solution in an amount corresponding to 50% of the whole polymerization solution was removed from the reactor, and the remaining polymerization solution was subjected to coupling reaction for 2 hour by adding 0.0127 part of tetramethoxy silane as a coupling agent. Thereafter, the reaction was terminated by adding 0.1 part of methanol as a polymerization terminator.

To the polymerization solution removed from the reactor was added 0.1 part of methanol as a polymerization terminator, and a part thereof was collected to remove a di-block copolymer which was then measured for its weight-average molecular weight. The result is shown in Table 1.

The di-block copolymer solution was mixed with the polymer solution after the coupling reaction, and to the whole of the polymers was added 2,6-di-t-butyl-p-cresol as an antioxidant in an amount of 0.3 part per 100 parts of the whole of the polymers, and then the polymer solution was dropped little by little to hot water heated at 85 to 95° C. to evaporate the solvent. The resulting precipitate was disrupted and dried with hot air at 85° C. to give a block copolymer composition V. The weight-average molecular weight, vinyl content and styrene unit amount of the block copolymer composition V, and the ratio by weight of the respective block copolymers were measured. The results are shown in Table 1. Numerical values calculated by the relationship are shown in Table 1.

A multilayer sheet was obtained in the same manner as in Example 1 except that the block copolymer composition V was used in place of the block copolymer composition I. This sheet was evaluated for its smoothness, antiflowing properties, stickiness and thin-line reproducibility. The results are shown in Table 1.

Comparative Examples 2 and 3

Block copolymer compositions VI and VII were obtained by polymerization in the same manner as in Example 1 except that the polymerization formulations shown in Table 1 were used. The physical properties of these block copolymer compositions are shown in Table 1.

Multilayer sheets were obtained in the same manner as in Example 1 except that the block copolymer compositions VI and VII were used in place of the block copolymer composition I. These sheets were evaluated for their smoothness, antiflowing properties, stickiness and thin-line reproducibility. The results are shown in Table 1.

TABLE 1

|  | Examples | | | | Comparative Examples | | |
| --- | --- | --- | --- | --- | --- | --- | --- |
|  | 1 | 2 | 3 | 4 | 1 | 2 | 3 |
| Polymerization formulation (parts) | | | | | | | |
| Styrene | 7.2 | 7.2 | 7.2 | 7.2 | 7.2 | 7.2 | 7.2 |
| n-Butyl lithium | 0.0441 | 0.0443 | 0.0439 | 0.0441 | 0.0441 | 0.00445 | 0.0449 |
| TMEDA | 0.0012 | 0.00121 | 0.00119 | 0.0417 | 0.0012 | 0.00121 | 0.00122 |
| Isoprene | 40.8 | 40.8 | 40.8 | 40.8 | 40.8 | 40.8 | 40.8 |
| Type of coupling agent | tetra-methoxy silane | diethyl adipate | penta-erythritol tetra-glycidyl ether | tetra-methoxy silane | tetra-methoxy silane | tetra-chloro-silane | methyl-trimethoxy silane |
| Amount of coupling agent (parts) | 0.0254 | 0.0358 | 0.0556 | 0.0254 | 0.0127 | 0.0284 | 0.0326 |
| Weight-average molecular weight of polystyrene block | 10,500 | 10,400 | 10,500 | 10,500 | 10,500 | 10,400 | 10,300 |
| Weight-average molecular weight of styrene/isoprene di-block copolymer | 97,500 | 97,200 | 98,000 | 95,600 | 97,500 | 96,800 | 95,900 |
| Block copolymer composition | I | II | III | IV | V | VI | VII |
| Weight-average molecular weight of the whole composition | 231,700 | 257,000 | 230,600 | 217,000 | 164,600 | 327,300 | 160,200 |
| Content of styrene unit (wt %) | 15.1 | 15.1 | 15 | 15.1 | 14.9 | 15.2 | 15.3 |
| Vinyl content (wt %) | 7 | 8 | 9 | 20 | 7 | 9 | 7 |
| Ratio (wt %) of each block copolymer | | | | | | | |
| Di-branched product: (A − B)2× | 2 | 1 | 2 | 1 | 1 | 0 | 65 |
| Tri-branched product: (A − B)3× | 60 | 55 | 51 | 62 | 30 | 7 | 5 |
| Tetra-branched product: (A − B)4× | 13 | 27 | 18 | 8 | 6 | 87 | 0 |

TABLE 1-continued

|  | Examples | | | | Comparative Examples | | |
| --- | --- | --- | --- | --- | --- | --- | --- |
|  | 1 | 2 | 3 | 4 | 1 | 2 | 3 |
| Styrene/isoprene di-block copolymer: A – B | 25 | 17 | 29 | 29 | 63 | 6 | 30 |
| Relationship | 3.1 | 3.3 | 3.2 | 3.1 | 3.1 | 3.9 | 2.1 |
| Physical properties of composition for photosensitive flexographic plates | | | | | | | |
| Sheet smoothness (points) | 5 | 4 | 5 | 5 | 5 | 3 | 5 |
| Sheet antiflowing properties (hours) | 240 | 240 | 240 | 240 | 24 | 192 | 90 |
| Sheet stickiness | ○ | ○ | ○ | ○ | x | ○ | Δ |
| Thin-line reproducibility (points) | 6 | 6 | 6 | 6 | 5 | 3 | 5 |

From Table 1, the followings are revealed.

When the block copolymer composition V wherein the content of the styrene/isoprene di-block copolymer is outside of the range prescribed in the present invention is used, the resulting composition for photosensitive flexographic plates forms a sheet inferior in antiflowing properties and becomes easily sticky (Comparative Example 1).

When the block copolymer composition VI having a copolymer ratio higher than the upper limit of the relationship prescribed in the present invention is used, the resulting composition for photosensitive flexographic plates forms a sheet inferior in smoothness and also in antiflowing properties and gives a flexographic plate inferior in thin-line reproducibility, because of a high content of the tetra-branched product (Comparative Example 2).

When the block copolymer composition VII having a copolymer ratio lower than the lower limit of the relationship prescribed in the present invention is used, the resulting composition for photosensitive flexographic plates forms a sheet inferior in antiflowing properties and stickiness, because of a high content of the di-branched product (Comparative Example 3).

As compared with the Comparative Examples described above, when the block copolymer compositions I to IV in the scope of the present invention are used, sheets having a smooth surface and excellent antiflowing properties and less apt to occur troubles caused by sticking are obtained, and flexographic plates excellent in thin-line reproducibility are obtained (Examples 1 to 4).

The invention claimed is:

1. A composition for photosensitive flexographic plates, comprising a block copolymer composition for photosensitive flexographic plates an ethylenically unsaturated compound and a photopolymerization initiator, wherein the block copolymer composition comprises:

at least one kind of block copolymer (a) selected from block copolymers represented by the following general formulae (a1) to (a3), and a block copolymer (b) represented by the following general formula (b):

$$(A-B)_2X \quad (a1)$$

$$(A-B)_3X \quad (a2)$$

$$(A-B)_4X \quad (a3)$$

$$A-B \quad (b)$$

wherein A is a polymer block of an aromatic vinyl monomer, B is a polymer block of a conjugated diene monomer, and X is a residue of a coupling agent having two or more functional groups of at least one kind selected from an alkoxyl group, an ester group and an epoxy group in the general formulae a1, a2, a3 and b, and which satisfies the following relationships:

Wa=50 to 100% by weight,

Wb=0 to 50% by weight, and $2.5 \leq (2 \times W2 + 3 \times W3 + 4 \times W4)/(W2+W3+W4) \leq 3.8$, wherein Wa, W2, W3, W4, and Wb are the contents, in terms of % by weight, of (a),(a1),(a2), (a3), and (b), respectively.

2. The composition for photosensitive flexographic plates according to claim 1, wherein the content of the aromatic vinyl monomer unit in the block copolymer composition for photosensitive flexographic plates is 5 to 25% by weight.

3. A flexographic plate obtained by exposing, to light, the composition for photosensitive flexographic plates according to claim 2.

4. The composition for photosensitive flexographic plates according to claim 1, wherein the weight-average molecular weight of the block polymer composition for photosensitive flexographic plates is 100,000 to 500,000.

5. A flexographic plate obtained by exposing, to light, the composition for photosensitive flexographic plates according to claim 4.

6. The composition for photosensitive flexographic plates according to claim 1, wherein the block copolymer composition for photosensitive flexographic plates comprises 0 to 20% by weight of the block copolymer (a1), 40 to 100% by weight of the block copolymer (a2), 0 to 50% by weight of the block copolymer (a3) and 0 to 50% by weight of the block copolymer (b).

7. A flexographic plate obtained by exposing, to light, the composition for photosensitive flexographic plates according to claim 6.

8. The composition for photosensitive flexographic plates according to claim 1, wherein the block copolymer composition for photosensitive flexographic plates comprises 55 to 95% by weight of the block copolymer (a) and 5 to 45% by weight of the block copolymer (b).

9. A flexographic plate obtained by exposing, to light, the composition for photosensitive flexographic plates according to claim 8.

10. The composition for photosensitive flexographic plates according to claim 8, wherein the block copolymer composition for photosensitive flexographic plates comprises 0 to 15% by weight of the block copolymer (a1), 40 to 95% by weight of the block copolymer (a2), 0 to 45% by weight of the block copolymer (a3) and 5 to 45% by weight of the block copolymer (b).

11. A flexographic plate obtained by exposing, to light, the composition for photosensitive flexographic plates according to claim 10.

12. The composition for photosensitive flexographic plates according to claim 1, wherein the block copolymer composition for photosensitive flexographic plates comprises 55 to 90% by weight of the block copolymer (a) and 10 to 45% by weight of the block copolymer (b).

13. The composition for photosensitive flexographic plates according to claim 12, wherein the block copolymer composition for photosensitive flexographic plates comprises 0 to 10% by weight of the block copolymer (a1), 45 to 90% by weight of the block copolymer (a2), 0 to 45% by weight of the block copolymer (a3) and 10 to 45% by weight of the block copolymer (b).

14. A flexographic plate obtained by exposing, to light, the composition for photosensitive flexographic plates according to claim 13.

15. A flexographic plate obtained by exposing, to light, the composition for photosensitive flexographic plates according to claim 12.

16. A flexographic plate obtained by exposing, to light, the composition for photosensitive flexographic plates according to claim 1.

* * * * *